United States Patent
Bolin et al.

[11] Patent Number: 6,023,611
[45] Date of Patent: Feb. 8, 2000

[54] FILTER DEVICE FOR SUPPRESSING HARMONICS IN RADIO FREQUENCY SIGNALS WHEN DUAL FREQUENCIES EXIST

[75] Inventors: Tomas Bolin, Lund; Per-Olof Brandt, Staffanstorp; Ulrik Imberg, Norrköping, all of Sweden

[73] Assignee: Telefonaktiebolaget LM Ericsson, Stockholm, Sweden

[21] Appl. No.: 09/023,162

[22] Filed: Feb. 13, 1998

[51] Int. Cl.[7] .................................. H04B 1/04; H03F 1/26
[52] U.S. Cl. .......................... 455/114; 455/103; 330/149; 330/151
[58] Field of Search ..................... 455/114, 553, 455/296, 307, 127, 179.1, 188.1, 103; 333/174, 175, 176; 330/149

[56] References Cited

U.S. PATENT DOCUMENTS

| | | | |
|---|---|---|---|
| 3,760,301 | 9/1973 | Goransson et al. | 333/174 |
| 4,621,244 | 11/1986 | Heiter | 333/81 |
| 4,723,306 | 2/1988 | Fuenfgelder et al. | 455/103 |
| 4,811,422 | 3/1989 | Kahn | 455/114 |
| 4,942,375 | 7/1990 | Petitjean et al. | 333/81 |
| 5,034,708 | 7/1991 | Adamian et al. | 333/161 |
| 5,187,457 | 2/1993 | Chawla et al. | 333/170 |
| 5,386,203 | 1/1995 | Ishihara | 333/129 |
| 5,423,074 | 6/1995 | Dent | 455/74 |
| 5,423,078 | 6/1995 | Epperson et al. | 455/553 |
| 5,877,653 | 3/1999 | Kim et al. | 330/149 |
| 5,893,026 | 4/1999 | Kim | 455/114 |

FOREIGN PATENT DOCUMENTS

| | | |
|---|---|---|
| 0500434 | 8/1992 | European Pat. Off. |
| 1532982 | 12/1989 | Russian Federation |

OTHER PUBLICATIONS

Tanaka, T; Akagi, H, A New Combined System of Series Active and Shunt Passive Filters Aiming at Harmonic Compensation for Large Capacity Thyristor Converters, IECON'91, 1991.

Primary Examiner—Dwayne D. Bost
Assistant Examiner—Joy Redmon
Attorney, Agent, or Firm—Burns, Doane, Swecker & Mathis, L.L.P.

[57] ABSTRACT

The present invention relates to a power amplifier device (10), switchable for at least two separate basic frequency bands, for radio frequency signals with effective suppression of harmonics, where harmonics, corresponding to a first basic frequency band, can be permitted to overlap the frequency range of at least one second basic frequency band. The power amplifier device (10) comprises a power amplifier (1) and an impedance matching circuit (2), switchable by means of a PIN-diode, which provides a load impedance adapted to each individual basic frequency band. Furthermore, the power amplifier device comprises a filter device (3) comprising a fixed low-pass filter (3*b*) and a switchable filter (3*b*) acting as an engageable and disengageable notch filter, which comprises at least one reversible PIN-diode. This switchable filter (3*a*) allows to pass, in a first mode, signals in the first basic frequency band and suppresses at the same time at least one order of harmonics corresponding to this basic frequency band. In a second mode, the second basic frequency band is transmitted without appreciable losses, and harmonics are suppressed by the fixed low-pass filter (3*a*).

15 Claims, 6 Drawing Sheets

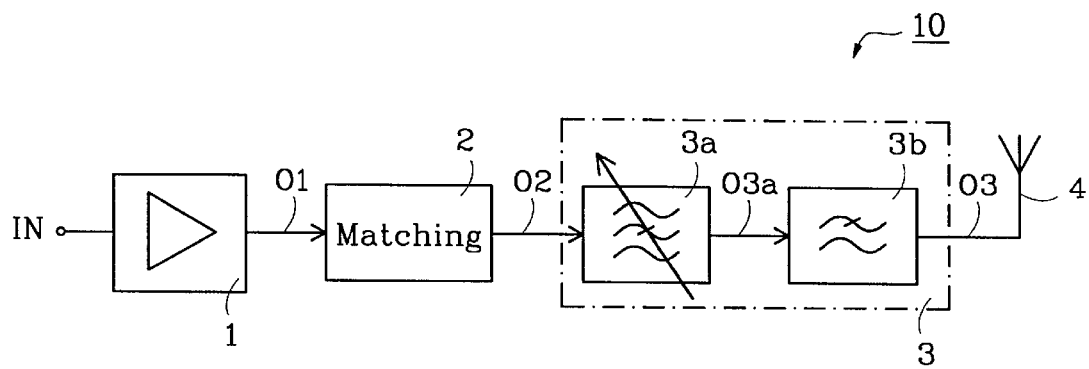
Fig. 2
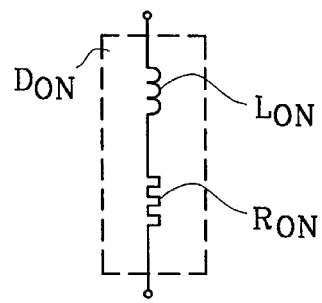
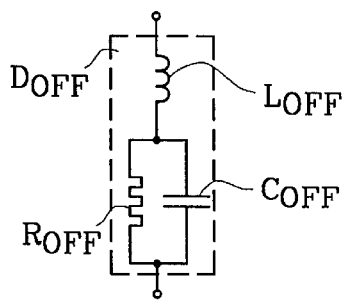
Fig. 3a    Fig. 3b
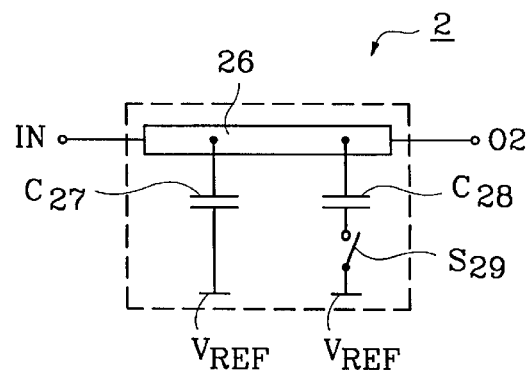
Fig. 4

FILTER DEVICE FOR SUPPRESSING HARMONICS IN RADIO FREQUENCY SIGNALS WHEN DUAL FREQUENCIES EXIST

TECHNICAL FIELD

The present invention relates to a device and a process, in radio frequency signals with at least two separate basic frequency bands, for suppressing harmonics corresponding to these basic frequency bands. The invention also relates to a power amplifier device for radio signals, switchable for at least two separate basic frequency bands.

RELATED ART

Most power amplifiers for radio transmitters with high efficiency work close to saturation and therefore generate, in addition to the desired radio signal frequency, also a not insignificant amount of power at harmonics of this frequency. In a power amplifier intended for only one fixed frequency band, these harmonics are filtered out with the aid of a low-pass filter placed between the outlet of the power amplifier and the antenna.

Of the harmonics generated, in general the second and third tones predominate, corresponding to a frequency which is two or three, respectively, times higher than the frequency of the basic tone. A special difficulty arises in the construction of transmitters intended for two separate frequency bands, if harmonics from the lower frequency band fall within the higher frequency band. This is, for example, the case if a mobile station for mobile telephony is to take care of both the GSM and the DCS-bands. The GSM-system (Global System for Mobile Communication) can work within a number of frequency bands. In addition to the original GSM frequency band at 900 MHz (GSM-900), there is also the 1900 MHz GSM-system. Furthermore, the DCS-system, which works at 1800 MHz, can also be considered to be a GSM-system. In the description below, the term GSM will, however, be used in its narrow definition as GSM-900. The power amplifier in a mobile station for GSM has a center frequency at approximately 900 MHz and an outlet power of 3 W, while a power amplifier for DCS (Digital Cellular System) works at about 1800 MHz and 1.5 W.

Since the DCS-band primarily lies twice as high in frequency as the GSM frequency band, problems will arise with harmonic filtration, if a common power amplifier is used for both frequency bands. The filtering can in this case not be taken care of by a common fixed low-pass filter.

It is previously known to use two separate, parallelly arranged, transmitting chains and a radio frequency switch circuit coupled to the outlet of these chains to select the currently desired frequency band. EP 500 434 presents a power amplifier module for mobile telephony which is intended for two separate radio frequency bands. This module contains two parallel chains with amplifier circuits and bandpass filters. The signal from these chains is conducted to the antenna outlet via coupling and decoupling circuits containing PIN-diodes. The switch circuits are constructed so that the amplifier circuit currently being used disconnects the outlet for the amplifier circuit of the other chain.

The PIN-diode is a commonly occurring component for switching radio signals. For radio frequency signals it has low series resistance in conducting state and high resistance in the reverse state. Furthermore, the PIN-diode requires a relatively low control current in the conducting state.

The PIN-diode, however, has stray inductances and stray capacitances. This means that the PIN-diode in the conducting state will have an essentially inductive characteristic while in the reverse state it will essentially have a capacitive characteristic. SU 1 532 982 presents a millimeter wave switch for a wave conductor, in which a PIN-diode is used as the switching means. The inner reactive properties of the PIN-diode are here compensated for a specific signal frequency by virtue of the fact that the PIN-diode in combination with an outer capacitance in a first position forms a parallel resonance circuit which blocks at this signal frequency. In another position, the PIN-diode forms in combination with an outer inductance, a series resonance circuit for the same signal frequency.

The above described known solution with two parallel power amplifier chains requires a significant number of components as compared to an amplifier device for one frequency band. This results in higher costs for materials, since the power amplifier for mobile telephony is an expensive component, and requires extra space, and this is a significant disadvantage, especially in mobile telephony since the space in the mobile stations is an important limiting factor.

SUMMARY OF THE INVENTION

It would thus be desirable to be able to provide a power amplifier device for radio frequency signals, comprising a filter device intended to suppress harmonics for at least two separate basic frequency bands. It is particularly desirable to be able to suppress those harmonics whose frequency range overlaps the frequency range of another basic frequency band. The present invention intends to solve the above problem.

The problem is solved by creating a filter device, the function of which corresponds to a combination of a first, fixed filter and a switchable second filter, preferably comprising a PIN-diode as the switchable means. The switchable second filter is arranged in a first mode to suppress at least one order of harmonics corresponding to at least a first basic frequency band. In a second mode the switchable second filter is arranged to provide good transmission of at least a second, higher basic frequency band. The first filter, which has a fixed characteristic, is arranged to attenuate higher order harmonics.

The switchable filter preferably comprises at least one shunt-coupled resonance circuit device. It comprises in turn a parallel coupling of a first reactive component and a PIN-diode. This parallel coupling is coupled in series with a second reactive component. By injecting a direct current through the diode in one of said first or second modes, so that it thereby becomes low-resistant, while the PIN-diode in another of said first or second modes is kept in a high-resistant state, the inner reactive properties of the diode are changed in such a manner that the PIN-diode in combination with said second reactive component in a first position, corresponding to one of said first or second modes, forms a series resonance circuit with a first resonance frequency adapted to the frequency bands in question. In a corresponding second position, the PIN-diode forms in combination with said first reactive component a parallel resonance circuit with a second resonance frequency adapted for the frequency bands in question. This second resonance frequency can have the same value as the first resonance frequency.

The said resonance frequencies are adapted so that the switchable filter in said first mode attenuates at least one order of harmonics corresponding to the first basic frequency band, while the switchable filter in said second mode provides good transmission of at least a second, higher basic frequency band.

According to a preferred embodiment of the invention, a plurality of shunt-coupled resonance circuit devices of the type described above can be combined, preferably separated by means of a transmission conductor of suitable length.

One purpose of the present invention is to achieve a device and a process for suppressing, in radio frequency signals with at least two alternative, separate basic frequency bands, harmonics corresponding to these basic frequency bands.

Another purpose of the present invention is to achieve a power amplifier device switchable for two separate basic frequency bands, for radio frequency signals with effective suppression of harmonics.

A significant advantage of the invention is the creation of a device and a process for suppressing, in radio frequency signals with at least two separate basic frequency bands, harmonics corresponding to these basic frequency bands, where harmonics can be permitted to overlap the frequency range of at least one of said basic frequency bands.

Another advantage of the present invention is the creation of a power amplifier device, switchable for two separate basic frequency bands, for radio frequency signals with effective suppression of harmonics, where the power amplifier device meets strict cost requirements, power consumption requirements and space requirements.

The invention will be explained in more detail below with the aid of examples with reference to the accompanying drawing.

LIST OF DRAWINGS

FIG. 2 is a composite block diagram of a power amplifier device according to the present invention.

FIG. 3a shows an equivalent diagram for a PIN-diode in its conducting state.

FIG. 3b shows an equivalent diagram for a PIN-diode in the reverse state.

FIG. 4 shows a wiring diagram which illustrates an impedance matching circuit made in accordance with the present invention.

PREFERRED EMBODIMENTS

Figure 1:
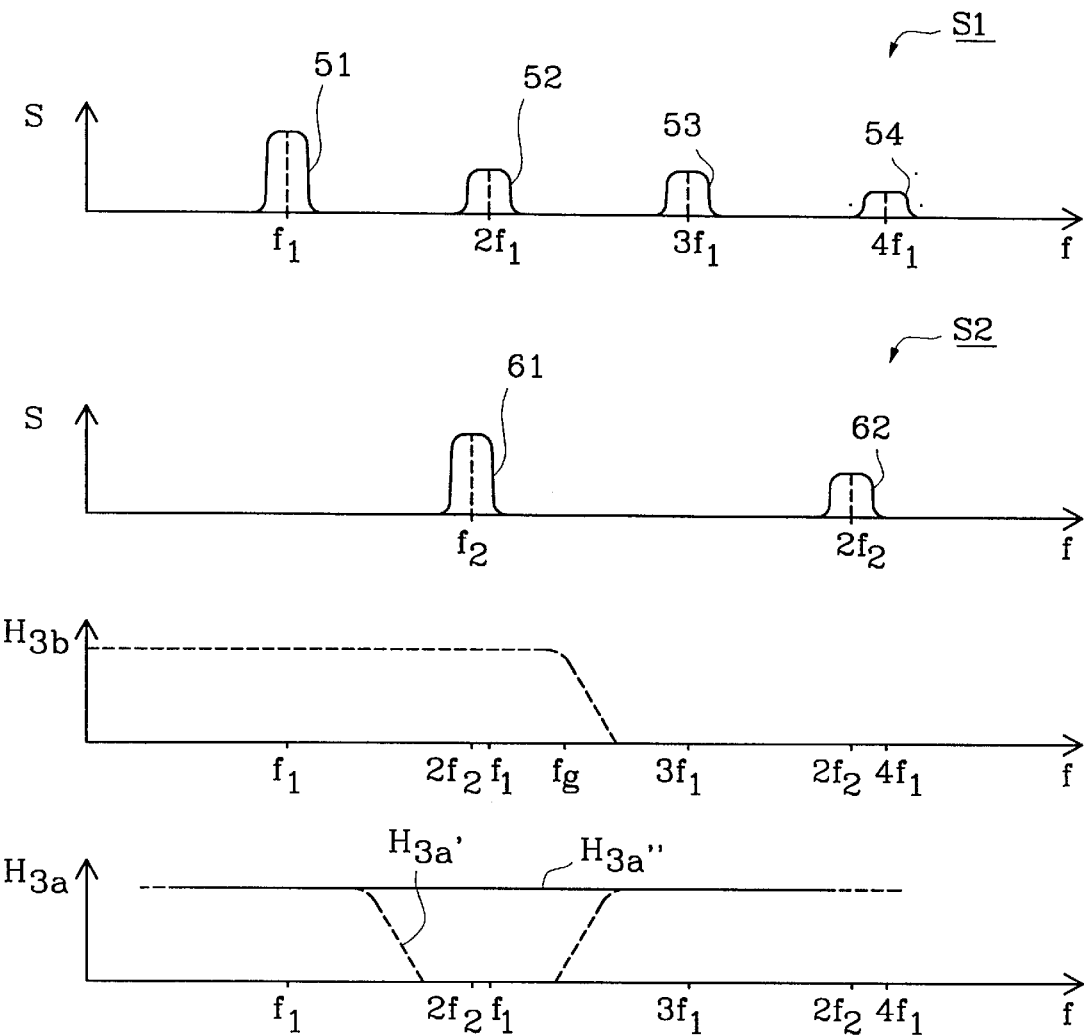
FIG. 1 is a signal/frequency diagram which illustrates one example of radio signals in the present invention and their frequency relation to each other.

FIG. 1, in which the letter f stands for frequency and the letter S stands for signal strength, shows frequency spectra for two radio frequency signals S1 and S2 from a power amplifier. This power amplifier exhibits a certain non-linearity, which causes harmonics in the amplified signals. The main power in the signal S1 is in a basic frequency band 51. This basic frequency band 51 has a center frequency $f_1$. The band width of the frequency band is, as in all the frequency band widths, exaggerated in the Figure in relation to the frequency scale shown. The signal S1 furthermore contains a number of frequency bands corresponding to harmonics, of which the first harmonic 52, the second harmonic 53 and the third harmonic 54 are shown in the Figure. These have their respective center of frequencies $2f_1$, $3f_1$, $4f_1$, which are multiples of the center frequency $f_1$ of the basic frequency band. In the same manner, there is shown for the signal S2 a basic frequency band 61 with a center frequency $f_2$, and a harmonic 62 with a center frequency $2f_2$.

In radio transmitters intended to transmit signals within a fixed frequency band, any harmonics generated are normally filtered out with the aid of fixed low-pass filters. The transmission function $H_{3b}$ of such a filter is shown in the Figure. If this filter is used for the signal S2, the frequency band 62 is filtered out together with any higher order of harmonics, and the desired basic frequency band 61 is left. If, however, the signals S1 and S2 are to be transmitted by a single radio transmitter, and be amplified by a common power amplifier device for both frequency bands 51, 61, there will be problems. Since the frequency $2f_1$ essentially matches the frequency $f_2$, as can be seen in the Figure, the frequency band 52 will partially overlap the basic frequency band 61. The construction of a fixed, common filter for effective suppression of all the harmonics in signals S1 and S2 can thus not be done. This situation corresponds substantially to that occurring in the design of a double band mobile station for the mobile telephony systems GSM and DCS, where the GSM frequency band lies around 900 MHz and the DCS frequency band lies around 1800 MHz. In the continued description of this example of the invention, the terms GSM-signal will be used for the signal S1, and DCS-signal for the signal S2.

In FIG. 2, a simplified block diagram is presented for a device for power amplification and transmission of a radio signal according to one embodiment of the present invention. A power amplifier device 10, which in this example is intended to be included in a transmitter portion of a mobile station for the mobile telephony systems GSM and DCS, is connected here to a transmitter antenna 4. The power amplification device 10 is switchable to handle in a first mode GSM-signals and in a second mode DCS-signals.

The power amplifier device 10 comprises a power amplifier 1 which has an inlet designated IN and an outlet O1. Furthermore, the power amplifier device 10 comprises an impedance matching circuit 2, which adapts the load impedance for the power amplifier 1 to the two frequency bands, and a filter device 3 connected to the outlet O2 of the impedance matching circuit. The transmitter antenna 4 is connected to the outlet O3 of the filter device 3. The mobile station in question comprises in this example a separate receiver antenna, but it is of course possible to integrate the receiver antenna with the transmitter antenna. In this case there will suitably be an antenna switching circuit between the filter device 3 and the antenna 4, to keep the receiver portion of the mobile station substantially insulated from the transmitted signal from the transmitter portion of the mobile station.

All power amplifiers with reasonable effectiveness must be impedance-matched at the outlet. This means for power amplifier 1 that it must provide a load impedance matching the frequency band in question. This load impedance is usually lower than the impedance of the antenna. The power amplifier device 10 comprises for this purpose a switchable impedance matching circuit 2 which, for each mode, individually offers an optimized load to the outlet of the power amplifier 1.

As can furthermore be seen in FIG. 2, the filter device 3 comprises a first, fixed filter 3b and a second, switchable filter 3a, these two filters being arranged in series. The first filter 3b has a low-pass characteristic, which is illustrated in FIG. 1 by a curve for the transmission function $H_{3b}$. This filter 3b has, as can be seen in FIG. 1, a pass band which covers both the basic frequency band 51 of the GSM-signal S1 and the basic frequency band 61 of the DCS-signal S2, and has a cut-off frequency $f_g$ such that the second harmonic, designated 53 in FIG. 1, of the GSM-band signal (essentially corresponding to 3 900=2700 MHz), is attenuated to a satisfactory degree. All the harmonics of higher orders as well are thus suppressed by this first filter 3b.

In this FIG. 2, the first filter 3b is placed behind the second filter 3a. It is also possible to change the order of these filters so that the first filter 3b is arranged prior to the second filter 3a.

The switchable filter 3a can in the first mode permit passage of signals in the basic frequency band 51 of the GSM-signal and at the same time suppress the first harmonic of these signals in the frequency band designated 52 in FIG. 1, lying substantially at 1800 MHz. The transmission function $H_{3a'}$ for the switchable filter 3a in this first mode is sketched in FIG. 1. As can be seen in the Figure, the filter in this mode has a band elimination characteristic. This characteristic of the filter 3a is only to be regarded as an example. What is important for the filter is that, in this mode, it suppresses the critical harmonics within the frequency band 52 and at the same time transmits the basic frequency band 51 without significant losses. The characteristic of the filter for the rest of the frequency spectrum is of minor importance.

In the second mode, the switchable filter 3a allows to pass the basic frequency band 61 of the DCS-signal with marginal attenuation. In this second mode, there is no inlet signal available on the GSM-band, and therefore transmission conditions around 900 MHz are of minor interest for this mode.

The transmission function $H_{3a''}$ for the switchable filter 3a in this second mode is also sketched in FIG. 1. As can be seen in the Figure, the filter in this mode has essentially an all-pass characteristic as regards the amplitude. For the second mode as well the described characteristic for the filter 3a is only to be regarded as an example. What is essential is that the filter in this second mode transmits the critical basic frequency band with marginal attenuation. The characteristic of the filter for the rest of the frequency spectrum is of minor importance.

FIG. 3a shows an equivalent circuit diagram for a PIN-diode where direct current is injected through the PIN-diode so that the diode is low resistant. A radio frequency signal then views the diode, designated $D_{ON}$ in the Figure, essentially as an inductance $L_{ON}$ in series with a resistance $R_{ON}$. A reasonable value of the resistance $R_{ON}$ is 1 Ω for a control current of circa 10 mA.

FIG. 3b shows a corresponding equivalent circuit diagram for the PIN-diode when the direct current through the PIN-diode is negligible so that the diode is in high resistance state. A radio frequency signal then views the diode, now designated $D_{OFF}$, as an inductance $L_{OFF}$ in series with a parallel arrangement of a resistance $R_{OFF}$ and a capacitance $C_{OFF}$. A reasonable value of the resistance $R_{OFF}$ lies in this case on the order or 10 kΩ. The value of the inductance $L_{OFF}$ substantially matches the value of the inductance $L_{ON}$ in the conducting state of the diode.

The impedance matching circuit 2 introduced in connection with the discussion of FIG. 2, is shown in more detail in FIG. 4. As can be seen from this FIG. 4, the impedance matching circuit 2 comprises a transmission conductor, here in the form of a microstrip element 26 and a shunt-wired first capacitance $C_{27}$. One end of the microstrip element constitutes the inlet to this impedance matching circuit 2, which is connected to the outlet O1 of the power amplifier 1. The opposite end of the microstrip element is the outlet O2 of the impedance matching circuit. The first capacitance $C_{27}$ is connected by one terminal to a point on the microstrip element 26 and by its other terminal connected to a fixed reference potential $V_{REF}$. Furthermore, the impedance matching circuit 2 also comprises a second capacitance $C_{28}$, which is connected by one terminal to a point on the microstrip element 26 lying closer to the outlet O2 than the point on the microstrip element where the first capacitance $C_{27}$ is connected. With its second terminal the second capacitance $C_{28}$ is connected to the reference potential $V_{REF}$ via a switching means $S_{29}$.

A common impedance matching method uses shunt-wired capacitances placed along a microstrip conductor. The adaption to higher frequencies will then normally result in shorter microstrip conductors and capacitances with lower values than for lower frequencies. Thus, an impedance matching circuit for DCS can be constructed as a portion of a matching circuit for GSM.

The impedance matching circuit 2 used here thus comprises the two said capacitances $C_{27}$ and $C_{28}$, separated by a section of the microstrip element 26. The inner first capacitance $C_{27}$ is the capacitance which would be obtained if matching were only desired for DCS-signals. The outer second capacitance $C_{28}$ is engaged when signals on the GSM-band are transmitted and is disengaged when the DCS-band is to be used. This switching is effected by technology which is known per se by changing the biasing of a PIN-diode.

In the impedance matching circuit 2, a PIN-diode is thus used for the switching means $S_{29}$. The capacitance $C_{28}$ can thereby be switched in and out to vary the load impedance. In the first mode of the power amplifier device, when a GSM-signal is transmitted, a direct current is injected through the PIN-diode, in accordance with technology which is known per se, via a DC-connection network (not shown in the Figure). The PIN-diode will thus be low-resistant. The capacitance $C_{28}$ will hereby be connected, and the impedance matching circuit 2 will provide a first value of the load impedance for the power amplifier 1. This first value of the load impedance assures that the power amplifier will have good matching at 900 MHz. In the other mode, which is intended for amplification and transmission of a DCS-signal, the direct current through the PIN-diode is shut off so that the PIN-diode blocks. In this case the impedance matching circuit 2 will have a second value of the load impedance so that the power amplifier will be impedance-matched for 1800 MHz.

An important advantage of this matching method is that it will thus be possible with the impedance matching circuit 2 to obtain a certain amount of attenuation of the first harmonic of the GSM-signal, since there is not perfect matching for 1800 MHz when the GSM-signal is to be transmitted. This filtering function of the matching circuit 2a in the first mode is accentuated if the matching circuit is separated from the subsequent switchable filter 3a by a transmission conducting element, the length of which at 1800 MHz substantially corresponds to one quarter of a wavelength.

It also appears difficult to design a fixed matching circuit with losses lower than what can be obtained with this type of circuit. As regards simplicity and robustness, a switchable impedance matching circuit according to the present invention is superior to any fixed matching circuit.

Figure 5:
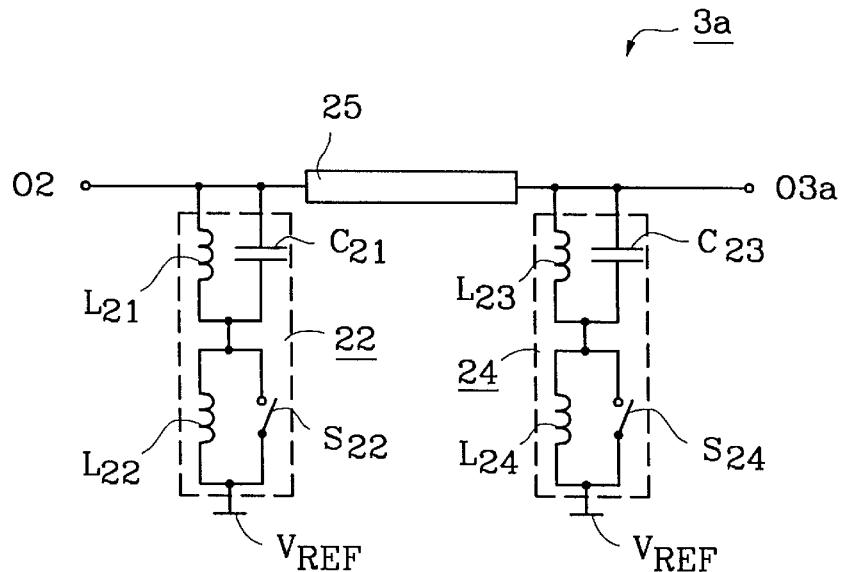
FIG. 5 shows a wiring diagram which illustrates a switchable filter made in accordance with the present invention.

FIG. 5 illustrates the switchable filter 3a, discussed in connection with FIG. 2, in more detail, although somewhat simplified. The inlet to the switchable filter device 3a, which is connected to the outlet O2 of the impedance matching circuit 2, is connected to one end of a transmission conducting element 25, the other end of which is connected to the outlet O3a of this switchable filter device 3a, where a filtered signal is obtained. To the inlet of the switchable filter device 3a there is also connected a first terminal of a total of two terminals belonging to a first resonance circuit device 22. This first resonance circuit device 22 comprises a first parallel connection of a first parallel connection of a first inductance $L_{22}$ and a first switching means $S_{22}$ constructed about a PIN-diode, as well as a second parallel connection of a second inductance $L_{21}$ and a first capacitance $C_{21}$, where this second parallel connection is arranged in series with the first parallel connection. A second terminal of the two terminals belonging to the first resonance circuit device 22 is connected to said fixed reference potential $V_{REF}$ The transmission conducting element 25 has a length which approximately corresponds to a quarter of a wavelength at 1800 MHz. At the end of this transmission conducting element 25 which is connected to the outlet O3a, there is connected a second resonance circuit device 24. This comprises a third inductance $L_{24}$, a second capacitance $C_{23}$, a fourth inductance $L_{23}$ and a second switching means $S_{24}$. It has in this example an identical construction to the first resonance circuit device 22 and also has a terminal connected to the reference potential $V_{REF}$.

In the resonance circuit device 22, the second inductance $L_{21}$ and the first capacitance $C_{21}$ in the second parallel connection are so adapted that they form a parallel resonance circuit with a resonance frequency which corresponds essentially to the basic frequency band of the GSM-signal. This means that the resonance circuit device 22 has high impedance to the reference potential $V_{REF}$. Thus, the basic frequency band of the GSM-signal will not be significantly affected by the resonance circuit device, and therefore a good transmission of signals within this frequency range will be obtained.

In a first mode for the switchable filter 3a, the PIN-diode is conducting. It will then have essentially an inductive characteristic. Together with said first capacitance $C_{21}$, the PIN-diode will thus form a series resonance circuit. This has a resonance frequency which is so adapted that the series resonance circuit gives rise to a blocking band, covering i.a. the first harmonic of the GSM-signal. This series resonance circuit thus provides satisfactory attenuation of the signal power at this harmonic.

In a second mode for the switchable filter 3a, the PIN-diode is in the high-resistant state, where it has an essentially capacitive characteristic. Together with said first inductance $L_{22}$, which is arranged in parallel with the PIN-diode, the PIN-diode thus forms a parallel resonance circuit with a resonance frequency essentially corresponding to the basic frequency band of the DCS-signal, designated 61 in FIG. 1. This parallel resonance circuit sees to it that it will be a good transmission of the signals at this frequency band in the second mode.

The second inductance $L_{21}$ and the fourth inductance $L_{23}$ are not completely necessary for the function of the filter. Without these two inductances, signals at 900 MHz will regard the resonance circuit device 22 and the resonance circuit device 24 as shunt-connected inductive impedances. With a suitable weighing of the value of the inductances $L_{21}$ and $L_{23}$ with regard to the length of the microstrip element 25, corresponding to an eighth of a wavelength for the frequency range in question of 900 MHz, these inductive impedances can be caused to cancel each other. In this way, good impedance matching is guaranteed for 900 MHz, and therefore the basic frequency band of the GSM-signal even in this variant of the example can be transmitted with only marginal losses.

Figure 8:
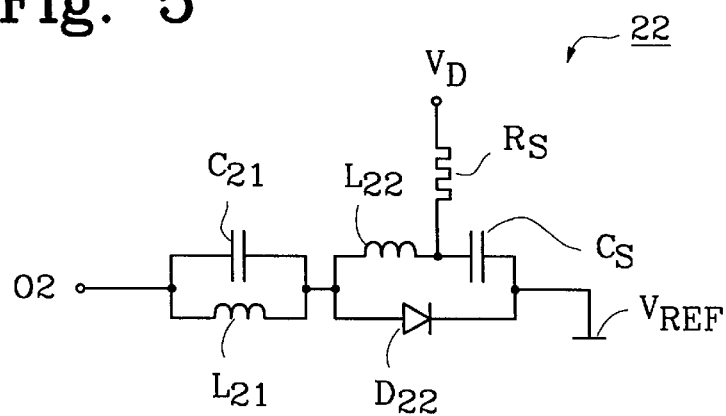
FIG. 8 is a wiring diagram for a resonance circuit device in accordance with the present invention.

FIG. 8 shows a somewhat more detailed connection diagram for the resonance circuit device 22 in FIG. 5, also showing the direct current supply to the PIN-diode. The resonance circuit device is connected between the inlet of the switchable filter, which is connected to the outlet O2 of the impedance matching device, and the fixed reference potential $V_{REF}$. The resonance circuit device comprises a first parallel connection. A first branch of this first parallel connection is the PIN-diode, designated $D_{22}$ in the Figure. A second branch of this first parallel connection consists essentially of a series connection of the first inductance $L_{22}$ and a blocking capacitance $C_S$. A drive voltage $V_D$ is connected via a resistance $R_S$ to a point between the first inductance $L_{22}$ and the blocking capacitance $C_S$. A second parallel connection between the second inductance $L_{21}$ and the first capacitance $C_{21}$ is connected in series with this first parallel connection.

The blocking capacitance $C_S$ prevents direct current from flowing directly between the drive voltage connection and the reference potential $V_{REF}$. The blocking capacitance has, however, such a high capacitance value that it can be regarded as a short-circuit for the signal frequencies in question. Thus, the signal will encounter a parallel connection of the PIN-diode $D_{22}$ and said first inductance $L_{22}$. Via the drive voltage connection, a control current can be injected through the diode. The resistance $R_S$ is so adapted to the drive voltage $V_D$ that a suitable value is obtained for this control current. With this design, the PIN-diode can consequently be caused, by controlling the drive voltage $V_D$, to switch between low resistant and high resistant states.

Figure 6A:
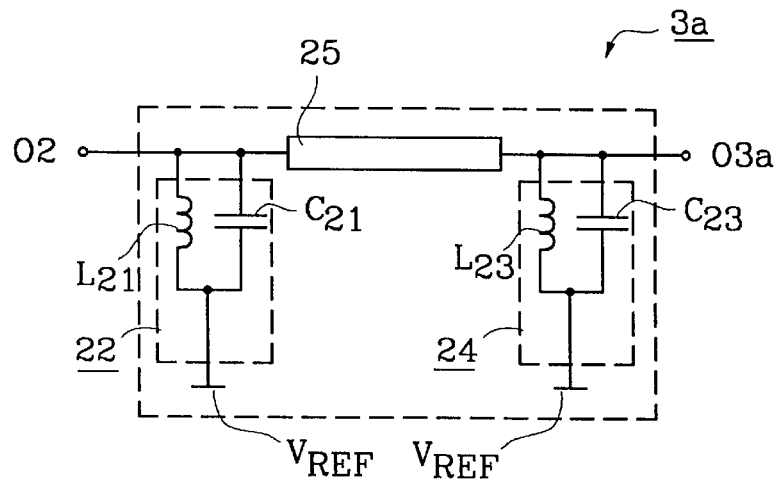
FIG. 6a is a wiring diagram simplified in comparison to the wiring diagram in FIG. 5 and illustrating an equivalent diagram for a lower basic frequency band in a first mode for the example.
Figure 6B:
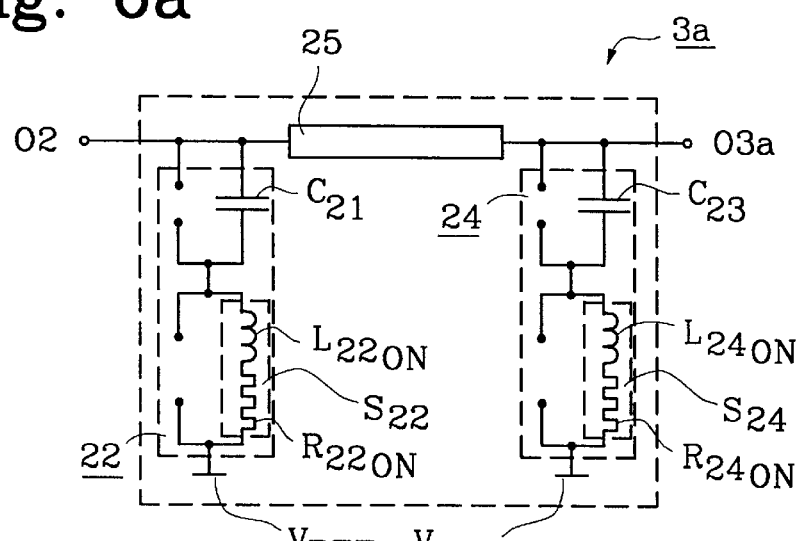
FIG. 6b is a wiring diagram, simplified in comparison to the wiring diagram in FIG. 5 and illustrating an equivalent diagram for one order of harmonics corresponding to a first, lower basic frequency band in a first mode for the example.

FIGS. 6a and 6b show simplified connection diagrams which illustrate the function of the switchable filter 3a in the first mode, in which the filter is optimized for filtering a GSM-signal. FIG. 6a shows here the filter 3a as signals around 900 MHz, such as the basic frequency band of the GSM-signal, view the filter. Since the first inductance $L_{21}$ and the first capacitance $C_{21}$ form a parallel resonance circuit with a resonance frequency at 900 MHz, their composite impedance is great at these frequencies. The other components indicated in this FIG. 6a in the first resonance circuit device 22 can be neglected. Since the resonance circuit devices 22 and 24 are identical in this example, the same conditions also apply to the second resonance circuit device 24. Signals within this frequency range will thus be transmitted from the inlet of the filter 3a to its outlet O3a with small losses.

FIG. 6b shows the filter 3a as the filter appears to signals around 1800 MHz, such as the first harmonic of the GSM-signal. In this first mode for the filter, the PIN-diode is in its low resistant state. The switching means $S_{22}$, which, as can be seen in FIG. 8, is the PIN-diode $D_{22}$, is seen here as a diode inductance $L_{22on}$ in series with a diode resistance $R_{22on}$. The resonance circuit device 22 will, for the frequency range in question at 1800 MHz, be dominated by a series resonance circuit which is formed of the diode inductance $L_{22on}$ and said first capacitance $C_{21}$. This first capacitance $C_{21}$ is so adapted that the series resonance circuit has a resonance frequency which approximately corresponds to the center frequency, designated $2f_1$ in FIG. 1, for the first harmonic 52 of the GSM-signal. This means that the value of the total impedance of the resonance circuit device 22 will be low in the frequency range in question at 1800 MHz. Therefore, the resonance circuit device 22 will attenuate the first harmonic of the GSM-signal. Since the two resonance circuit devices 22 and 24 are identical, they will each attenuate the harmonic in question. Since the resonance circuit devices 22 and 24 are separated by the microstrip element 25, the length of which for 1800 MHz corresponds to one quarter wavelength, the resonance circuit devices 22 and 24 will cooperate so that the total attenuation will be, somewhat simplified, twice as great, computed in decibels, as the attenuation in each resonance circuit device taken individually.

As viewed over a broader frequency range, the switchable filter 3a functions as a band elimination filter, a so-called notch-filter. The over-function $H_{3a'}$ in FIG. 1 illustrates this situation.

Figure 7:
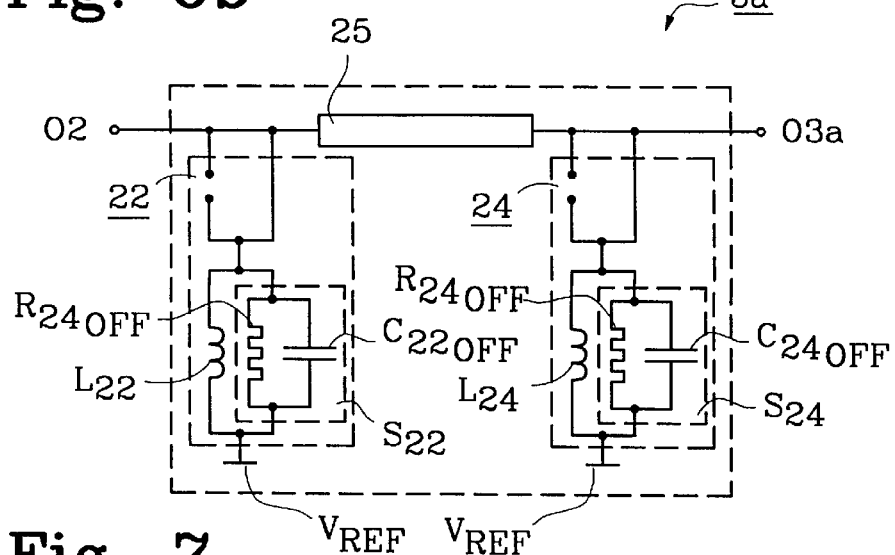
FIG. 7 is a wiring diagram simplified in comparison to the wiring diagram in FIG. 5 and illustrating an equivalent diagram for a second, higher basic frequency band in a second mode for the example.

FIG. 7 shows a simplified connection diagram which illustrates the function of switchable filter 3a in the second mode, the filter being adapted for transmission of a DCS-signal. In this FIG. 7, the filter 3a is shown as signals around 1800 MHz, such as the basic frequency band of the DCS-signal, view the filter. The switch means $S_{22}$ and $S_{24}$ in the resonance circuit devices 22 and 24 are in the open position. This means that the PIN-diodes included in the switching means in this second mode are high-resistive. The PIN-diodes perform, somewhat simplified, as a diode resistance $R_{22off}$ parallel to a diode capacitance $C_{22off}$, and as a diode resistance $R_{24off}$ parallel to a diode capacitance $C_{24off}$, respectively. For the frequency range at 1800 MHz in question the resonance circuit device 22 will be dominated by a parallel resonance circuit which is formed by the diode capacitance $C_{22off}$ and said first inductance $L_{22}$. This first inductance $L_{22}$ is adapted so that the parallel resonance circuit has a resonance frequency which approximately corresponds to the center frequency, designated $f_2$ in FIG. 1, for the basic frequency band 61 of the DCS-signal. This means that the value of the total impedance of the resonance circuit device 22 will be high in the frequency range in question around 1800 MHz. The resonance circuit device 22 will therefore transmit the basic frequency band of the DCS-signal with only low attenuation. Since the parallel resonance circuits 22 and 24 are identical, the same situation will apply for the second parallel resonance circuit 24. The signals within the frequency range in question will thus be transmitted from the inlet of the filter 3a to its outlet O3a with only low losses.

Figure 9:
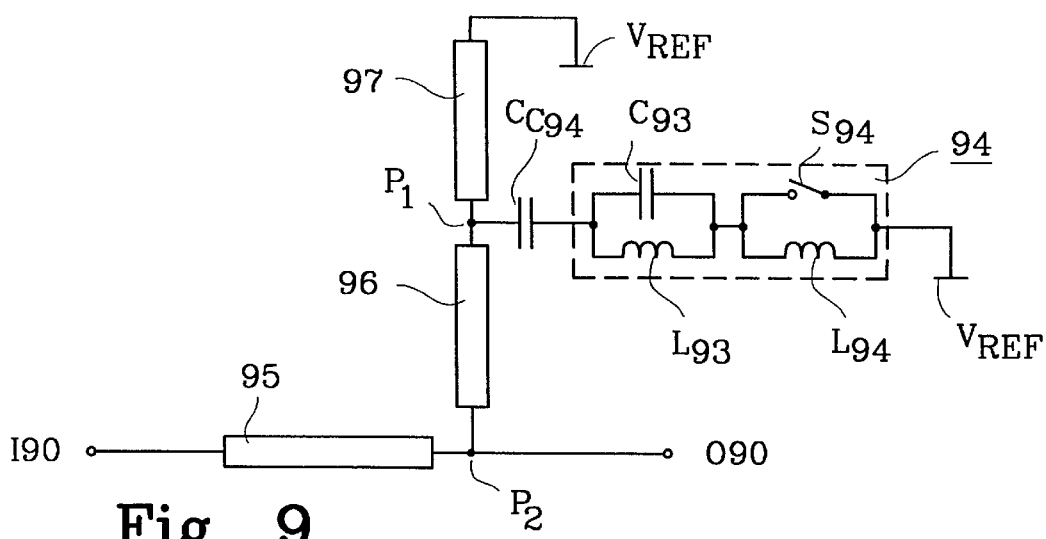
FIG. 9 is an alternative embodiment to the circuit in FIG. 5 for the switchable filter.

FIG. 9 shows an alternative embodiment of the switchable filter 3a. The filter, which in this FIG. 9 is designated 90, comprises a first microstrip element 95, which connects the outlet O90 of the filter with its inlet 190. Furthermore, the filter comprises a shunt-connected microstrip conductor divided serially into a second microstrip element 96 and a third microstrip element 97. These each have a length which approximately corresponds to a quarter wavelength at 1800 MHz, which also corresponds to an eighth wavelength at 900 MHz. A first end of the second micro-strip element 96 is connected to the outlet O90 of the switchable filter 90. The second end of the second microstrip element 96 is connected in a point $P_1$ to a first end of the third microstrip element 97. Correspondingly, the second end of the third microstrip element 97 is connected to the reference potential $V_{REF}$ and is thus short-circuited at this point.

At said second end of the first microstrip element 96, also a first terminal of a resonance circuit device 94 is connected via a coupling capacitance $C_{C94}$. A second terminal of the resonance circuit device 94 is connected to the reference potential $V_{REF}$. The resonance circuit device 94 has in this example as regards radio frequencies an entirely equivalent structure as the resonance circuit devices 22 and 24 described in connection with FIGS. 5, 6a, 6b and 7. It comprises a first parallel connection of a first inductance $L_{94}$ and a switching means $S_{94}$ constructed about a PIN-diode. In series with this first parallel connection there is arranged a second parallel connection of a second inductance $L_{93}$ and a first capacitance $C_{93}$.

The first capacitance $C_{93}$ and the second inductance $L_{93}$ form a parallel resonance circuit with a resonance frequency at circa 900 MHz. Ideally, the resonance circuit device 94 does not thereby affect the impedance as viewed by the basic frequency band of the GSM-signal. When the total length of the microstrip elements 96 and 97 corresponds to a quarter wavelength at 900 MHz, the short-circuit at said second end of the microstrip element 97 is transformed, independently of the resonance circuit device 94, into a very high impedance at point $P_2$. The GSM-signal transmitted via the first microstrip element 95 consequently views the shunt-connected microstrip conductor as a break which does not affect the signal. It is thus guaranteed that the basic frequency band of the GSM-signal be transmitted through the filter with only marginal attenuation.

Since the length of said second microstrip element 97 corresponds to a quarter wavelength for 1800 MHz, the short-circuit in said second end of the microstrip element 97 is transformed into, loosely expressed, an infinite impedance at point $P_1$ for signals within this frequency range. Therefore, these signals only view the impedance contributed by the resonance frequency device 94. In a first mode for the filter 90, the PIN-diode in the switching means $S_{94}$ is in a high-resistive state. Thus a parallel resonance circuit is formed of the first inductance $L_{94}$ and the capacitance which the PIN-diode in the switching means $S_{94}$ shows in this position. The resonance frequency for this parallel resonance circuit is adapted to circa 1800 MHz, which means that the resonance circuit device 94 in total will show high impedance for this frequency range. This high impedance which signals at 1800 MHz thus view at point $P_1$ is transformed to low impedance at point $P_2$, which means that signals around 1800 MHz will be practically short-circuited by the shunt-connected micro-strip conductor. Thus the filter 90 provides good attenuation of signals around 1800 MHz in this first mode.

In a second mode for the filter 90, the PIN-diode in the switching means $S_{94}$ is in a low-resistive state. A series resonance circuit is formed of the first capacitance $C_{93}$ and the inductance which the PIN-diode here shows. The resonance frequency for this series resonance circuit is adapted to circa 1800 MHz, which means that the resonance circuit device 94 displays in total a very small impedance for this frequency. This low impedance which signals at 1800 MHz view at point $P_1$ is transformed to high impedance at point $P_2$, which means that signals around 1800 MHz will be transmitted through the filter with only low attenuation.

In summary, the filter 90 acts as a band elimination filter which can be turned on and off. If additional attenuation is required in the first mode, i.e. when the band elimination function is turned on, several identical filter devices can be coupled in series, suitably separated by a piece of transmission conductor having a length corresponding to a quarter wavelength at the frequency which one desires to attenuate. This procedure provides approximately twice the attenuation as computed in decibels in comparison to the attenuation of the filter devices individually. The same effect is obtained if this quarter wavelength transmission conductor element is replaced, in accordance with technology which is known per se, with a so-called Π-network (pi-network) or a T-network, preferably made up of discrete components.

It is furthermore possible, in the same manner, to combine a filter 9 with a resonance circuit device arranged as one of the resonance circuit devices 22 and 23 in the example presented in connection with FIGS. 5 to 8.

Figure 10:
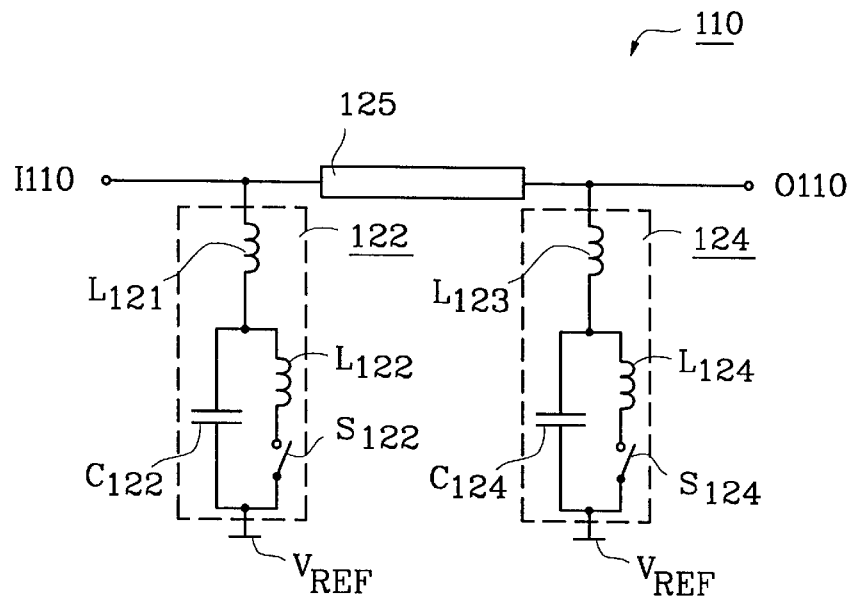
FIG. 10 illustrates a simplified wiring diagram for an additional alternative embodiment of the switchable filter.
Figure 11:
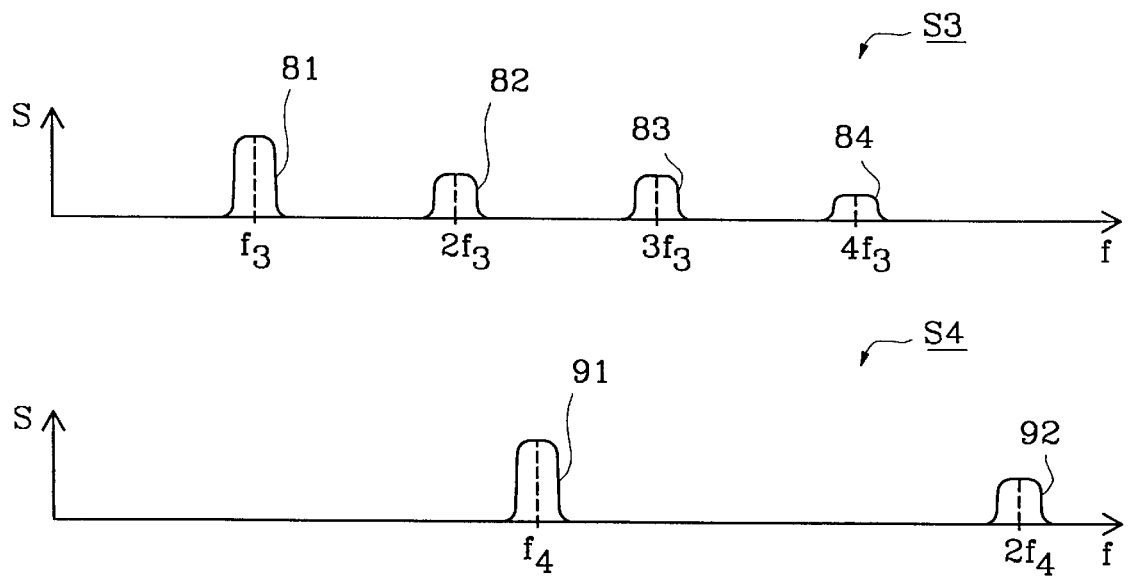
FIG. 11 is a signal/frequency diagram illustrating an additional example of radio signals in the present invention and their frequency relation to each other.

FIG. 10 shows an alternative embodiment of the switchable filter 3a. The filter, which in this FIG. 10 is designated 110, comprises a microstrip element 125, which connects the outlet O110 of the filter to its inlet I110. The microstrip element 125 has a length which substantially corresponds to a quarter wavelength at 1800 MHz. At the outlet O110, a first terminal of a first resonance circuit device 124 is connected. A second terminal of this first resonance circuit device 124 is connected to the reference potential $V_{REF}$. Said first resonance circuit device 124 comprises a first parallel connection of a first capacitance $C_{124}$ and a series connection of a first inductance $L_{124}$ and a first switching means $S_{124}$ built up around a PIN-diode. In series with this first parallel connection, a second inductance $L_{123}$ is arranged. At the inlet I110 there is connected a first terminal of a second resonance circuit device 122. This second resonance circuit device 122 preferably has a structure identical to said first resonance circuit device 124, and comprises a second capacitance $C_{122}$, a second switching means $S_{122}$, a third inductance $L_{122}$ and a fourth inductance $L_{121}$.

In a first mode for the switchable filter 110, the PIN-diodes in the switching means $S_{122}$ and $S_{124}$ are in high-resistive state. In this state they have essentially a capacitive characteristic. However, the value of the capacitances of the PIN-diodes is such that these capacitances in a first approximation can be ignored in relation to the capacitances $C_{122}$ and $C_{124}$, which are connected in parallel to the diodes. In the first resonance circuit device 124, a series resonance circuit is here formed of, essentially, said first capacitance $C_{124}$ together with said second inductance $L_{123}$. This series resonance circuit has a resonance frequency which is so adapted that the series resonance circuit gives rise to a blocking band, covering i.a. the first harmonic of the GSM-signal. In the same manner, in the resonance circuit device 122 as well, a series resonance circuit with substantially the same properties is formed. The resonance circuit devices 122 and 124 thereby cooperate to achieve the intended attenuation at this harmonic.

For the basic frequency band of the GSM-signal at 900 MHz, the resonance circuit devices 122 and 124 act as shunt-connected capacitive elements, the values of which essentially are determined by the previously mentioned series resonance circuits which are formed by the capacitance $C_{122}$ and the inductance $L_{122}$, and the capacitance $C_{124}$ and the inductance $L_{124}$. The relationship between the capacitance $C_{124}$ and the inductance $L_{124}$ is, however, adapted so that the basic frequency band of the GSM-signal at 900 MHz will experience the resonance circuit device 124 as a capacitive element with just the right value so that the microstrip element 125, the length of which at these frequencies corresponds to one eighth wavelength, will transform this capacitive value into the inductive value required at the first resonance circuit device 122 to compensate its capacitive effect. In this way, good impedance matching is guaranteed for 900 MHz, and therefore the basic frequency band of the GSM-signal can be transmitted through the filter 110 with only marginal losses.

In a second mode for the switchable filter 110, the PIN-diodes are in low-resistive state. In this state they have a substantially inductive characteristic. In the resonance circuit device 124, the inner inductance of the PIN-diode in the switching means $S_{124}$ and the first inductance $L_{124}$ thereby form a parallel resonance circuit together with said first capacitance $C_{124}$. This parallel resonance circuit displays a resonance frequency which essentially corresponds to the basic frequency band of the DCS-signal, which is designated 61 in FIG. 1. This parallel resonance circuit thereby sees to it that the resonance circuit device 124 displays high impedance for signals at 1800 MHz. In this way the basic frequency band of the DCS-signal is not affected appreciably by this shunt-connected first resonance circuit device 124. Since the resonance circuit devices 122 and 124 are identical, the second resonance circuit device 122 will not affect the basic frequency band of the DCS-signal appreciably either. This provides low losses for frequencies about 1800 MHz in this second mode.

The first inductance $L_{1124}$ in the first resonance circuit device 124 and the third inductance $L_{122}$ in the second resonance circuit device 122 are not entirely necessary for the functioning of the filter. The purpose of these inductances is to affect the resonance frequency of said series resonance circuits. Since the reactive elements must be dimensioned in relation to each other and the inner reactances of the PIN-diodes in order to obtain the desired resonance frequencies, the inductances $L_{124}$ and $L_{122}$ affect the dimensioning of the other reactive elements in the resonance circuit devices 124 and 122 in such a manner that more suitable values are obtained for this example. Another possibility for affecting the dimensioning of the reactive elements in the resonance circuit devices 124 and 122 is to combine two or more PIN-diodes by parallel and/or series-connection.

All of the examples described hitherto are intended for power amplifier devices in dual band mobile stations for the mobile telephone systems GSM and DCS. The invention is, of course, not limited only to this situation. For example, the invention can also be utilized in a mobile station for GSM and PCS-bands. FIG. 1 shows the relationship between the signals in this case. In this Figure, S designates the signal strength and f the frequency. A GSM-signal S3 from a power amplifier comprises a basic frequency band 81 with a center frequency $f_3$ around 900 MHz. Furthermore, the GSM-signal comprises odd and even harmonics in at least three frequency bands 82, 83 and 84. These frequency bands 82, 83 and 84 are centered around the frequencies $2f_3$, $3f_3$ and $4f_3$, which are multiples of the frequency $f_3$. A PCS-signal S4 from the same power amplifier comprises a basic frequency band 91 with a center frequency f₄ around 1800 MHz. Furthermore, the PCS-signal comprises harmonics in a number of frequency bands, of which one frequency band 92 is shown in the Figure. As can be seen in the Figure, the frequency band 82 from the GSM-signal S3 will be very close to, if not overlapping, the basic frequency band 91 from the PCS-signal S4. Suppressing, with a single fixed filter device, all of the harmonics and at the same time guaranteeing good transmission of the basic frequency bands 81 and 91, due to the steepness which this conceived filter device must display, is extremely difficult and in practice nearly out of the question. A switchable filter device according to the present invention provides a solution to this problem.

The invention is also suited to those cases where the relationship between the two basic frequency bands to be transmitted is such that the frequency bands end up at a reasonable distance from each other. For example, in a filter device which is constructed in accordance with the example in FIG. 5, the resonance frequencies of the resonance circuits can be selected in principle independently of each other, which means that the mutual relationship between the basic frequency bands is unimportant for the functioning of the circuit.

Furthermore, it is also possible with the present invention to achieve common power amplifier devices for three separate frequency bands such as, for example, GSM, DCS and PCS. For this case the amplifier and filter function for the DCS and PCS-signals are suitably provided in a common mode, while the GSM-signals are amplified and filtered in another mode. It is also possible to connect in series two or more filter devices, suitably individually switchable, for use in radio transmitters for three or more separate frequency bands. Suitably, each filter device here has the characteristic of a notch filter which can be switched on and off.

Another concrete example of an area of use for the invention is dual band mobile stations for the Japanese mobile telephony system PDC (Personal Digital Cellular) which is used at 800 MHz and at 1500 MHz. Furthermore, the invention can, of course, also be used for radio transmitters which are used in other contexts than mobile telephony and in other radio frequency areas.

Figure 12:
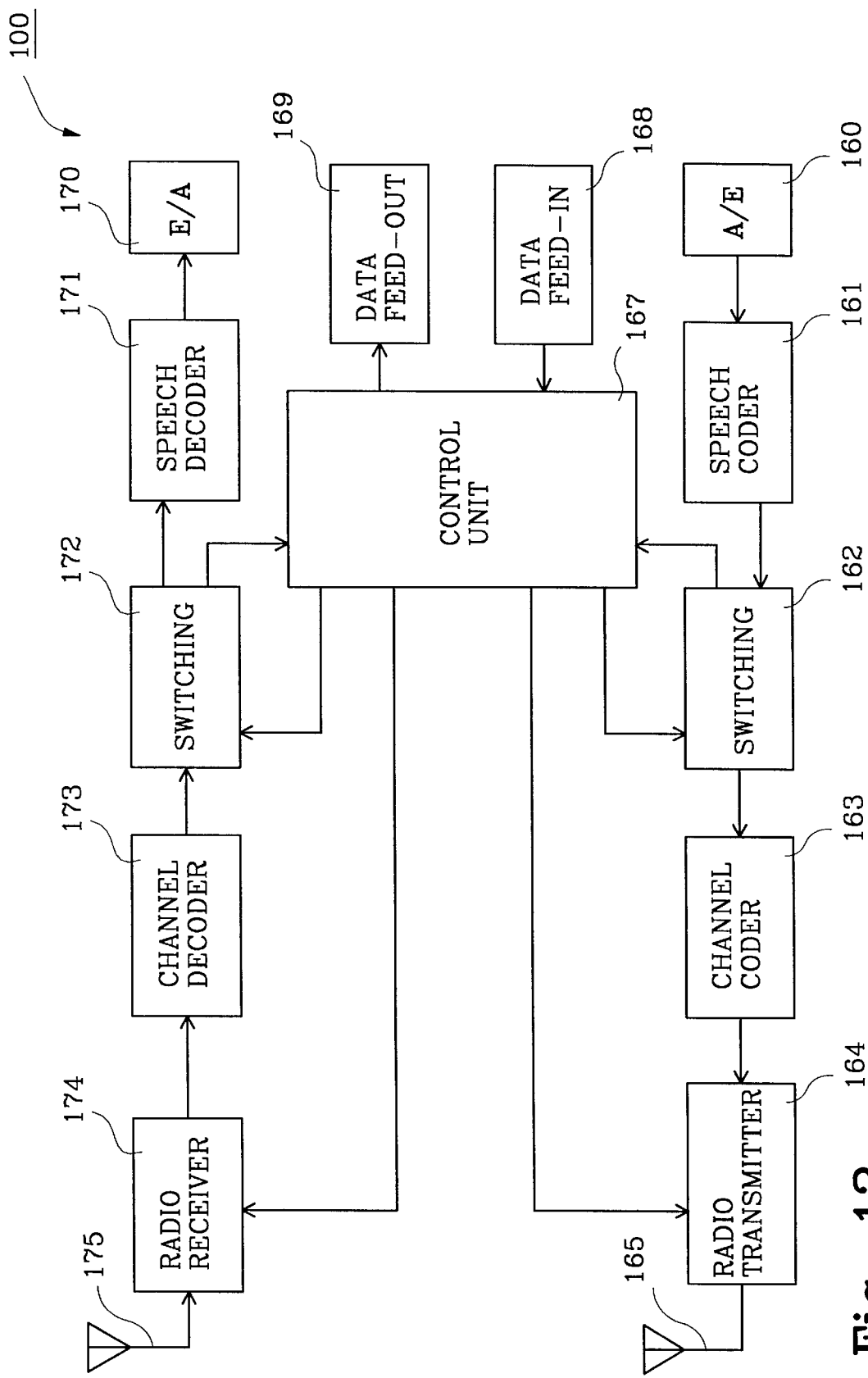
FIG. 12 illustrates a simplified block diagram of a mobile station.

A simplified block diagram of a dual band mobile station 100 for mobile telephony is illustrated in FIG. 12. This mobile station is intended for speech and data transmission over two separate frequency bands, one at a time. The mobile station comprises an acousto-electrical (A/E) converter 160 coupled to a speech coder 161, which digitalize the speech information from the acousto-electrical converter. The speech coder 161 is coupled via a first switching means 162 to a channel coder 163. The channel coder is connected to a radio transmitter 164. The radio transmitter comprises a switchable power amplifier device, which is designated 10 in FIG. 2, and is connected to an antenna 165.

To an antenna 175, which can possibly be the same antenna as the antenna 165, a radio receiver 174 is coupled. The radio receiver is coupled to a channel decoder 173. The channel decoder 173 is via a second switching means 172 connected to a speech decoder 171. The speech decoder 171 is connected to an electro-acoustic (E/A) converter 170 and decodes the digital information into analog sound information.

A control unit 167 has a first data inlet coupled to a data feed-in means 168 and a first data outlet connected to the first switching means 162. Furthermore, the control unit 167 has a second data outlet coupled to the second switching means 172 and a third data outlet coupled to a data feed-out means 169. Moreover, the control means has additional control outlets which are not shown in the Figure.

The control unit 167 can, via its control outlets, control the radio transmitter 164 and the radio receiver 174, i.a. for setting the mode for the power amplifier device and selecting radio traffic channels and time slot. Furthermore, the control unit can, via its control outlets, affect the switching means so that they provide and receive either speech information or another type of data.

When transmitting speech from the mobile station to a base station, for example, the speech is digitalized in the speech coder 161 prior to transmission. The digital signals representing the speech, are sent via the first switching means 162 to the channel coder 163, in which they are coded for transmission on a radio traffic channel with an error-correcting coding which extends over three or more successive time slots allocated to the mobile station. The transmitter modulates and power-amplifies the digital signals and sends them at high speed during a time slot under the control of the control signals from the control unit.

When transmitting data from the mobile station to a base station, data is fed into the control unit 167 with the data feeding means 168. From the control unit there are sent digital signals representing fed-in data via the first switching means 162 to the channel coder 163. In the channel coder 163, digital signals from the control unit are coded in the same manner as digital signals from the speech coder 161. The digital signals from the control unit are thereafter transmitted via the radio transmitter in the same manner as speech.

When transmitting speech from a base station to the mobile station 100 on a radio traffic channel, the digital signals are received in the radio receiver 174 at high speed in a time slot under the control of signals from the control unit 167. The digital signals are demodulated and conducted from the radio receiver 174 to the channel decoder 173. In the channel decoder 173, an error-correcting decoding takes place, which in principle is an inverse of the coding which takes place in the channel coder 163. The digital signals from the channel decoder 173 are sent via the second switching means 172 to the speech decoder 171. In the speech decoder, the digital information from the switching means is decoded to analog sound information.

We claim:

1. Filter device (3) intended for suppressing harmonics in radio frequency signals (S1,S2,S3,S4), comprising a first filter (3b) with fixed characteristic, and a second filter (3a,90,110), which is arranged in series with the first filter (3b), characterized in that the second filter (3a,90,110) is switchable and comprises at least one resonance circuit device (22,24,94,122,124) with a first and a second terminal, where the first terminal is connected to a transmission conducting element (25,96,125) included in the resonance circuit device, and the second terminal is connected to a reference potential ($V_{REF}$), where the resonance circuit device (22,24,94,122,124) comprises:

firstly, a first parallel connection of a first reactive element ($L_{22}, L_{24}, L_{94}, C_{122}, C_{124}$) and at least one reversible PIN-diode ($D_{22}$), and secondly, a second reactive element ($C_{21}, C_{23}, C_{93}, L_{122}, L_{124}$), where it is arranged in series with the first parallel connection, the second, switchable filter (3a, 90,110) being arranged:

to, in a first mode, provide good transmission of the radio frequency signal (S1,S3) in a first, lower, basic frequency band (51,81) and suppress at least one order of harmonics corresponding to this first basic frequency band (51,81), and to, in a second mode, provide good transmission of the radio frequency signal (S2,S4) in a second, higher, basic frequency band (61,91), the first filter (3b) suppressing at least one order of harmonics (62,92) corresponding to this second basic frequency band (61,91).

2. Filter device according to claim 1, characterized in that said PIN-diode ($D_{22}$) in the resonance circuit device (22,24, 94,122,124) is disposed to assume, in one of said first and second modes, a low-resistive state, where the characteristic of the PIN-diode ($D_{22}$) is essentially inductive, and in another of said first and second modes, to assume a high-resistive state, where the characteristic of the PIN-diode ($D_{22}$) is essentially capacitive.

3. Filter device according to claim 2, characterized in that the PIN-diode ($D_{22}$) in combination with said second reactive component ($C_{21},C_{23},C_{93},L_{121},L_{123}$) in a first position, corresponding to one of said first and second modes, is disposed to form a series resonance circuit with a first resonance frequency adapted to the frequency bands in question, and that the PIN-diode in the corresponding second position is disposed, in combination with said first reactive component ($L_{22},L_{24},L_{94},C_{122},C_{124}$), to form a parallel resonance circuit with a second resonance frequency adapted to the frequency bands in question, this second resonance frequency being able to show the same value as said first resonance frequency.

4. Filter device according to claims 1, characterized in that said first reactive element ($L_{22},L_{24},L_{94}$) is inductive, and that said second reactive element ($C_{21},C_{23},C_{93}$) is capacitive.

5. Filter device according to claim 4, characterized in that said resonance circuit device (22,24,94) is disposed so that the PIN-diode ($D_{22}$) in low-resistive state, where the PIN-diode shows inductive characteristic, is disposed to form a series resonance circuit with said second reactive elements ($C_{21},C_{23},C_{93}$), and that the same PIN-diode ($D_{22}$) in high-resistive state, where the PIN-diode has capacitive characteristic, is disposed to form a parallel resonance circuit with said first reactive element ($L_{22},L_{24},L_{94}$).

6. Filter device according to claim 5, characterized in that said series resonance circuit gives the second filter (3a) a band elimination characteristic for at least one order of harmonics corresponding to the first basic frequency band (51,81).

7. Filter device according to claim 5, characterized in that said parallel resonance circuit gives the second filter (3a) a passband characteristic for the second, higher basic frequency band (61,91).

8. Filter device according to one of claim 4, characterized in that a third reactive element ($L_{21},L_{23},L_{93}$) in the form of an inductance, is arranged in parallel to said second reactive element ($C_{21},C_{23},C_{93}$) in such a manner that a parallel resonance circuit is formed, where this parallel resonance circuit displays a resonance frequency which essentially corresponds to the center frequency ($f_1,f_3$) of the first frequency band (51,81).

9. Filter device according to claim 1, characterized in that the filter device (3) comprises two resonance circuit devices (22,24,122,124).

10. Filter device according to claim 9, characterized in that said two resonance circuit devices (22,24,122,124) are separated by a transmission conducting element (25,125), the length of which substantially corresponding to a quarter wavelength at the center frequency ($f_2,f_4$) of said second basic frequency band (61,91).

11. Process for suppression of harmonics in a radio frequency signal (S1,S2,S3,S4) in a filter device according to claim 1, characterized by the following steps:

setting the second, switchable filter (3a,90,110) in a first mode;

transmitting the radio frequency signal (S1,S3) in the first, lower frequency band (51,81) and suppressing at least one order of harmonics (52,82) corresponding to said first basic frequency band;

setting the second, switchable filter (3a,90,110) in a second mode;

transmitting the radio frequency signal (S2,S4) in the second, higher basic frequency band (61,91), said first filter (3b) suppressing at least one harmonic (62,92) corresponding to this second basic frequency band (61,91).

12. Power amplifier device (10) for radio frequency signals, comprising:

a power amplifier (1);

an impedance matching circuit (2) arranged at the outlet of the power amplifier (1), and a filter device (3) connected to the outlet of the impedance matching circuit (2) for suppression of harmonics, the function of which corresponds to a combination of:

a first filter (3b) with fixed characteristic, and a second filter (3a,90,110) arranged in series with the first filter (3b), characterized in that the power amplifier device (10) has at least two modes, where the modes correspond to adapting the properties of the power amplifier device (10) to at least one basic frequency band (51,61) each, and that the second filter (3a,90,110) is switchable and arranged:

in a first mode of said modes, to provide good transmission for a first, lower basic frequency band (51,81) and suppress at least one order of harmonics corresponding to this first basic frequency band (51,81), and in a second mode of said modes, to provide good transmission for a second, higher basic frequency band (61,91).

13. Power amplifier device according to claim 12, characterized in that the impedance matching circuit (2) comprises a PIN-diode functioning as switching means ($S_{29}$) with the aid of which an element ($C_{28}$) can be connected and disconnected, whereby the load impedance of the power amplifier (1) is adapted to the respective first and second modes.

14. Power amplifier device according to claim 13, characterized in that said element ($C_{28}$) consists of a capacitance.

15. Mobile station (100) in a cellular communication network, where the mobile station is intended for communication with at least one base station over at least two alternative, separate radio frequency bands, the mobile station comprising at least one power amplifier device (10) for radio frequency signals, comprising:

a power amplifier (1);

an impedance matching circuit (2) arranged at the outlet of the power amplifier (1), and a filter device (3) connected to the outlet of the impedance matching circuit (2) for suppression of harmonics, the function of which corresponding to a combination of:

a first filter (3b) with fixed characteristic, and a second filter (3a,90,110) arranged in series with the first filter (3*b*), characterized in that the power amplifier device (10) has at least two modes, where the modes correspond to adapting of the properties of the power amplifier device (10) to at least one basic frequency band (51,61) each, and that the second filter (3*a*,90,110) is switchable and arranged:

in a first mode of said modes, to provide good transmission of a first, lower basic frequency band (51,81), and suppress at least one order of harmonics corresponding to this first basic frequency band (51,81), and in a second mode of said modes, to provide good transmission of a second, higher basic frequency band (61,91).

* * * * *